United States Patent
O'Brien et al.

(10) Patent No.: US 8,373,312 B2
(45) Date of Patent: Feb. 12, 2013

(54) SOLAR POWER GENERATION STABILIZATION SYSTEM AND METHOD

(75) Inventors: Kathleen Ann O'Brien, Niskayuna, NY (US); Robert William Delmerico, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 812 days.

(21) Appl. No.: 12/565,004

(22) Filed: Sep. 23, 2009

(65) Prior Publication Data

US 2010/0008119 A1    Jan. 14, 2010

Related U.S. Application Data

(63) Continuation-in-part of application No. 12/023,368, filed on Jan. 31, 2008, now Pat. No. 8,237,301.

(51) Int. Cl.
*H01H 9/54* (2006.01)

(52) U.S. Cl. ........................................ 307/140

(58) Field of Classification Search ................... 307/140
See application file for complete search history.

(56) References Cited

U.S. PATENT DOCUMENTS

| | | | |
|---|---|---|---|
| 4,189,648 A | 2/1980 | Harner | |
| 4,233,590 A | 11/1980 | Gilkeson et al. | |
| 7,227,275 B2 | 6/2007 | Hennessy et al. | |
| 7,345,373 B2 | 3/2008 | Delmerico et al. | |
| 7,355,297 B2 | 4/2008 | Andrew et al. | |
| 2007/0120369 A1 | 5/2007 | Delmerico et al. | |

FOREIGN PATENT DOCUMENTS

| | | |
|---|---|---|
| EP | 0228497 A1 | 7/1987 |
| JP | 10042471 A | 2/1998 |
| WO | 03/023224 A1 | 3/2003 |
| WO | 03/023933 A1 | 3/2003 |
| WO | 2004/027959 A1 | 4/2004 |

OTHER PUBLICATIONS

U.S. Appl. No. 12/023,368, Office Action, Sep. 15, 2010.
M. A. Hassouneh, H-C. Lee and E. H. Abed; "Washout Filters in Feedback Control: Benefits, Limitations and Extensions"; Proceedings of the American Control Conference, pp. 3950-3955, Boston, MA, Jun.-Jul. 2004.
Barry Rawn; "A Stabilization Role for Wind Energy Conversion Systems"; Ph.D. Research Proposal Presentation; Nov. 21, 2005; Downloaded from the Internet:<http://www.ecf.utoronto.ca/~rawn/BR-Proposal-Nov21.pdf>; 24 Pages.
Clemens Jauch and Syed M. Islam; "Identification of a Reduced Order Wind Turbine Transfer Function from the Turbine's Step Response"; Downloaded from the Internet<http://www.itee.uq.edu.au/~aupec/aupec05/AUPEC2005/Volume1/S115.pdf; 4 Pages.

*Primary Examiner* — Robert L. Deberadinis
(74) *Attorney, Agent, or Firm* — Ann Agosti

(57) ABSTRACT

A power generation system including a photovoltaic (PV) module to generate DC power is provided. The system includes a combination of a DC to DC converter and a DC to AC converter coupled to the DC to DC converter for supplying power from the PV module to a power grid. The system further includes a bidirectional converter and an energy storage device coupled to the bidirectional converter. The system also includes a control system to generate commands for controlling a state of charge of the energy storage device. The control system comprises a deadband limiter to detect a deviation of the frequency signal outside of a respective signal range, a power shaper to provide a transient power generation adjustment signal in response to the signal being outside of the respective signal range and a limit controller for preventing the adjustment signal from causing the energy storage device to operate outside of at least one operating constraint.

16 Claims, 6 Drawing Sheets

SOLAR POWER GENERATION STABILIZATION SYSTEM AND METHOD

CROSS REFERENCE TO RELATED APPLICATIONS

This Application is a continuation-in-part of U.S. patent application Ser. No. 12/023,368, filed Jan. 31, 2008, which application is herein incorporated by reference.

BACKGROUND

The invention relates generally to a solar power generation system and more specifically to the use of energy storage in conjunction with a solar power generation system. The invention additionally relates to grid frequency stabilization of a grid connected solar power generation system.

Solar power generation systems have photovoltaic (PV) modules, which produce electrical power. In order to feed the electrical power to the grid, power electronic elements are used for power conditioning. In one example, the power electronic elements include a direct current (DC) to DC converter and a DC to alternating current (AC) inverter connected back to back through a DC link.

As new grid codes are developed for solar power generation systems, and as market penetration level of solar power increases, variability of solar power is becoming less acceptable to utility companies. For example, utility companies are imposing or expected to impose requirements related to power ramp rate limits, curtailment, and frequency stabilization.

Frequency stabilization relates to stabilizing the grid frequency. It is a well-known characteristic of utility systems that the grid frequency tends to decrease when the load exceeds the generation and to increase when the generation exceeds the load. Such decreases or increases may occur in a monotonic manner, an oscillating manner, or combinations thereof when the grid is subjected to a sudden change in the balance between generation and load. It is a consideration in the design of such a system that any method to achieve compensation of such decreases or increases should be one that does not result into aggravating the grid oscillations.

Therefore, it would be desirable to have a system and method to efficiently address variability of solar power to help satisfy the related utility company requirements.

BRIEF DESCRIPTION

In accordance with an exemplary embodiment of the present invention, a power generation system is provided. The system comprises a DC to DC converter and a DC to AC converter coupled to the DC to DC converter. The combination of the DC to DC converter and the DC to AC converter is configured for supplying power from a photovoltaic module to a power grid. The system further includes a bidirectional converter coupled to the DC to AC inverter. The system also includes an energy storage device coupled to the bidirectional converter and a control system to generate commands for controlling a state of charge of the energy storage device. The control system includes a deadband limiter to detect a deviation of the frequency signal outside of a respective signal range, a power shaper to provide a transient power generation adjustment signal in response to the signal being outside of the respective signal range, and a limit controller for preventing the adjustment signal from causing the energy storage device to operate outside of at least one operating constraint.

In accordance with another exemplary embodiment of the present invention, a method for delivering solar power from a power generation system comprising a PV module and an energy storage is provided. The method includes determining when a frequency signal of the power generation system is outside of a respective signal range and providing a transient power generation adjustment signal in response to the frequency signal being outside of the respective signal range. The method further includes providing transient power from the energy storage device based on the transient power generation adjustment signal.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As discussed in detail below, embodiments of the present invention function to provide a system and a method for transferring power from a solar power generation system to a power grid for stabilizing the grid frequency.

Figure 1:
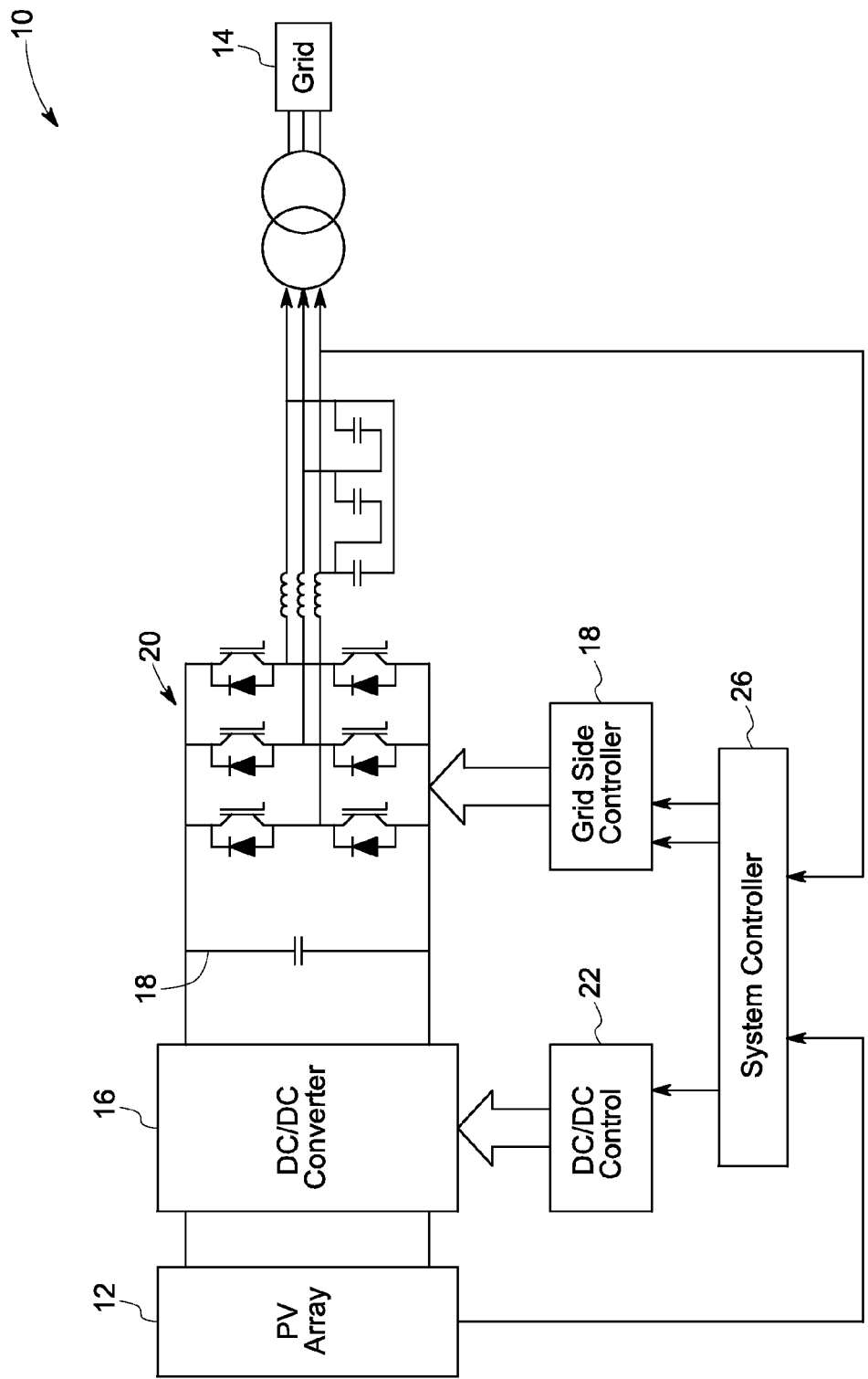
FIG. 1 is a diagrammatical representation of a conventional solar power generation system.

FIG. 1 illustrates a conventional solar power generation system 10. The power generation system includes a PV array 12 including a plurality of connected PV modules or PV strings (not shown). The PV array is connected to a power grid 14 through a DC/DC converter 16, a DC link 18, and a grid side three-phase DC/AC converter 20. The DC/DC converter 16 maintains a constant DC voltage at the DC link 18, and thus the energy flow from the PV module 12 to the power grid 14 is managed. The DC/DC converter 16 is controlled by a DC/DC controller 22, and the grid side converter 20 is controlled by a grid side controller 24. A system controller 26 generates a reference DC voltage command, a reference output voltage magnitude command, and a reference frequency command for the DC/DC converter 22 and grid side converter 20. In other systems, the grid side three-phase converter may be replaced by multiple single-phase converters and/or a single controller may be used for the multiple control functions shown in FIG. 1.

Figure 2:
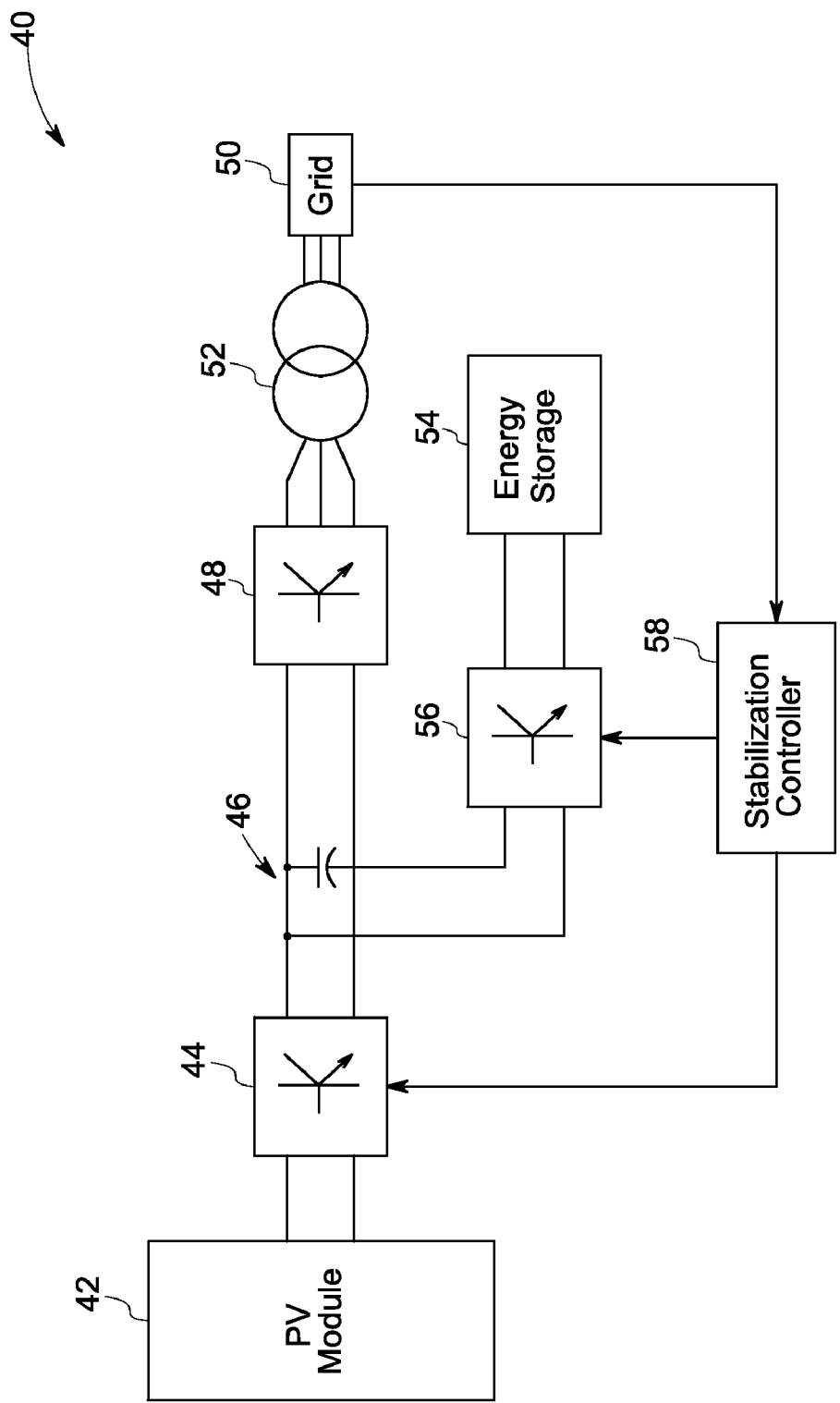
FIG. 2 is a diagrammatical representation of a solar power generation system including an energy storage device in accordance with an embodiment of the present invention.

FIG. 2 illustrates a solar power generation system 40 in accordance with an embodiment of the present invention. The system 40 includes a PV module 42, a first DC to DC converter 44 coupled to a DC link 46 and a DC to AC inverter 48 which feeds electrical power to the grid 50 through a transformer 52. The transformer 52 is used to match the grid voltage with output voltage of the DC to AC inverter 48. The system 40 further includes an energy storage device 54, which is coupled to the DC link 46 via a second bidirectional DC to DC converter 56. In one embodiment, the energy storage device may be a supercapacitor or an electrochemical battery or combinations thereof. A stabilization controller 58 controls the bidirectional DC to DC converter 56 based on the grid condition. Stabilization controller 58 may be a stand alone controller or included as an additional control function in a controller such as those discussed with respect to FIG. 1. In one embodiment, the controller 58 identifies the existence of fluctuations in the grid frequency and provides a reference transient power signal to the converter 56. The converter 56 then provides the transient power to the DC link from the energy storage device. In one example, the transient power or the temporary power boost may be increased by five to ten percent for up to ten seconds. Providing a transient response has several benefits in addition to grid stability, including, for example, use of stored energy that would not otherwise be available at the solar power generation system output without the need to build in operating margin (e.g., by curtailed mode operation). In one embodiment, first the controller 58 may command the first DC to DC converter 44 to supply the transient power to the grid from the PV module, and, when the PV module reaches its maximum power limit, the controller commands the bidirectional converter to supply power to the grid from the energy storage device 54. In another embodiment, the energy storage device is charged during normal operation of the solar power generation system. For example, when there is no dip in the grid frequency or when the PV module is supplying excess power, the stabilization controller 58 may command the bidirectional converter 56 to fetch active power from the PV module 42 via the first DC to DC converter 42 to charge the energy storage device 54.

Figure 3:
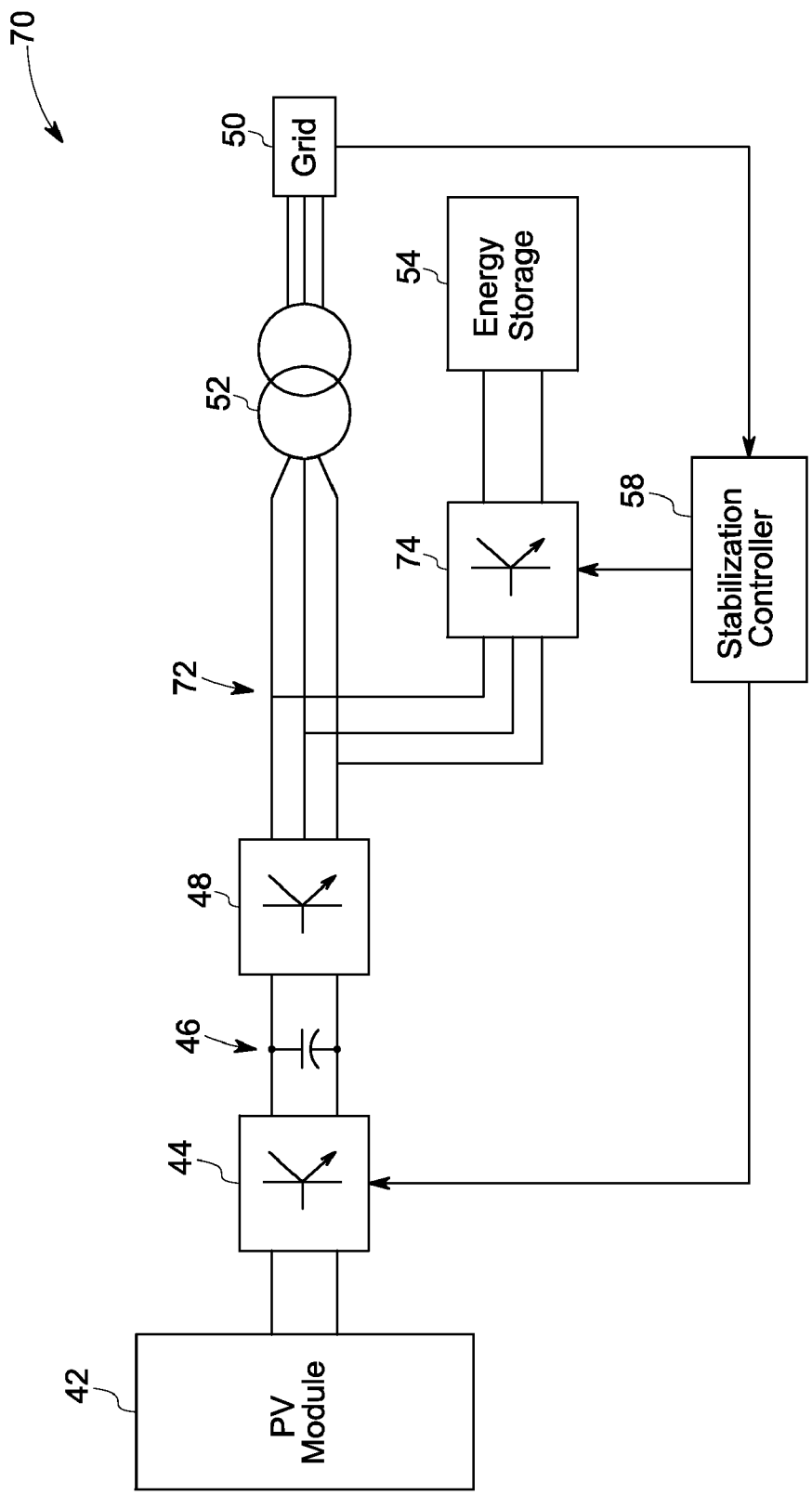
FIG. 3 is a diagrammatical representation of an solar power generation system including an energy storage device in accordance with another embodiment of the present invention.

FIG. 3 illustrates an alternative solar power generation system 70 in accordance with an embodiment of the present invention. In this embodiment, the energy storage device 54 is connected to AC side 72 of the DC to AC inverter 48. Thus, a bidirectional DC to AC converter 74 is utilized to transfer DC power from the energy storage device to the AC grid. In one embodiment, the stabilization controller 58 provides a reference transient power signal to the converter 74 based on the fluctuations in the grid frequency. Further, the controller 58 may also provide transient power signal to converter 44 when the PV module has not reached its maximum power limit or when the PV module is supplying excess power and then the controller 58 provides the transient power signal to the converter 74. The embodiment of FIG. 3 will typically have lower installation and interconnection costs than the embodiment of FIG. 2. The coupling of the bidirectional converter 74 to the DC to AC converter may be either by direct connection to the DC to AC converter or by connection through the transformer 52 and/or power lines between the DC to AC converter and the grid. Thus, the bidirectional converter 74 may be situated either near the DC to AC converter or at a remote location, such as two to three miles from the DC to AC converter.

Figure 4:
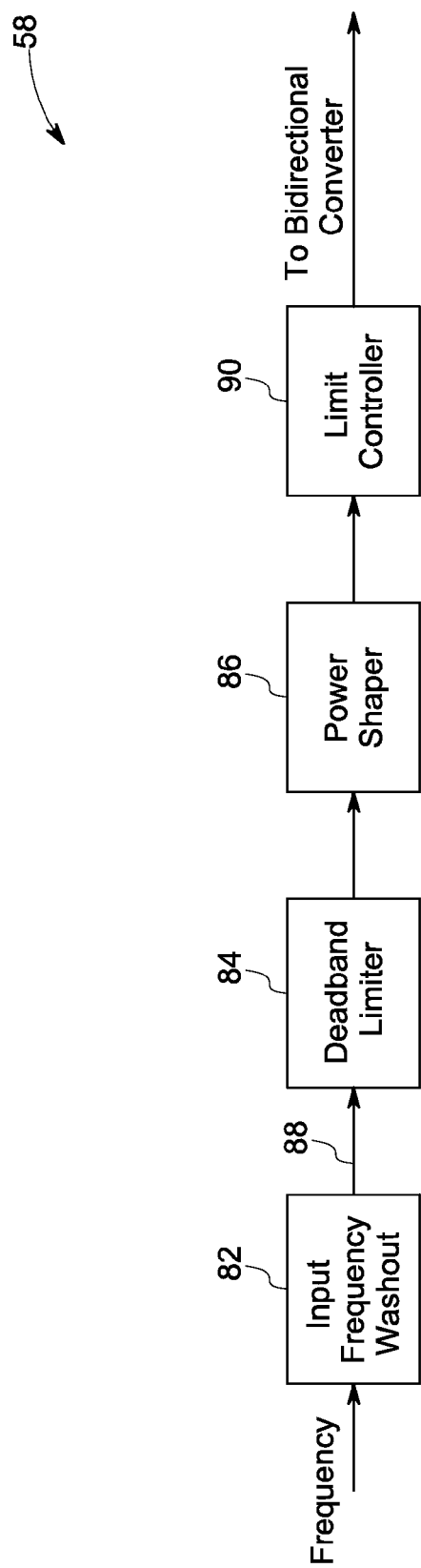
FIG. 4 is a high level block diagram of a stabilization controller in accordance with an embodiment or the present invention.

FIG. 4 is a high level block diagram of a stabilization controller 58 in accordance with one embodiment of the present invention. The controller 58 includes an input frequency washout 82, a deadband limiter 84, and a power shaper 86. The input frequency washout 82 tracks slow variations in the grid frequency and calculates frequency deviations around the center point. The deadband limiter 84 is used for detecting when a signal 88 of power generation system 10 is outside of a signal range. In one embodiment, the signal may comprise any appropriate signal with one example comprising a signal corresponding to system frequency or a frequency deviation signal from the input frequency washout 84 as shown in the figure. The signal may be obtained either by direct measurement of the respective signal or by measurement of another signal and computations to obtain the respective signal.

The power shaper 86 is configured for providing a transient power generation adjustment signal to the bidirectional converter in response to the signal 88 being outside of the signal range. A limit controller 90 is also provided in the controller 58 to prevent the adjustment signal from causing the energy storage device of the power generation system to operate outside of at least one operating constraint. In one embodiment the operating constraint may be a current rating of the energy storage device.

The deadband limiter 84 is configured to limit the frequency deviation signal between frequency threshold values determined by the application. Utility grid frequency will have a nominal value that is typically either 50 or 60 Hertz. However, the frequency may drift somewhat such that the center point is at a different value such as 59.9 Hz rather than 60 Hz, for example. The input frequency washout 82 is used to find the actual frequency rather than the nominal.

The frequency deadband limiter 84 is used to limit the transient response of solar power generation system to sufficiently large events. Frequency will always vary somewhat due to dithering that occurs when loads come on and off the system. For example, load variation typically affects frequency by about 0.05 Hz, depending on the system. The stabilization controller 58 is used for more significant events that occur when a sudden difference is present between load and generation such as a utility system losing a large generator or a transmission line tripping. In one example, the deadband is set at plus or minus 0.12 Hz off the center point frequency. The selection of this limit is typically based on factors such as the location and nature of the power generation system and the variability of frequency center points. The stabilization controller 58 may have a variable limit that is set by the end user after taking into account such factors.

The power shaper 86 is configured to shape a pulse in response to the frequency event and decrease the frequency disturbance magnitude in the power generation system. Although the shaper may be made to address either positive or negative frequency events, the shaper will be particularly useful in embodiments addressing negative frequency events because less alternatives (other than curtailed power operation) exist to momentarily increase power above nominal.

The adjustment signal of the power shaper is typically constrained so as to limit oscillatory coupling. In one embodiment, a "fast up, slow down" shaping characteristic is used so that the adjustment signal behaves like a filter such that, if the grid frequency is oscillating, then the profile does not make the oscillations worse. If the grid is oscillatory but at a level smaller than the deadband, no adjustment signal is generated. If the grid is oscillatory and larger than the deadband, than the shaping characteristic prevents the compounding of the oscillation. The shape of the power adjustment signal will be controlled by gain and ramp values that will typically vary with application, due to differing utility requirements and responses.

The limit controller 90 is used to prevent the energy storage device to supply a current or a voltage or even energy beyond the safety range of the energy storage device. Most energy storage devices or battery sources have a predetermined current range and a predetermined voltage range. In one embodiment, the battery source may be rated for 50 A current for 100 Hrs. The goal when the operating constraint is rated current is to ensure that no request is processed for additional power when the energy storage device is supplying a maximum current. Rated current and rated energy are examples of an operating constraint. Other constraints may be used in addition or alternatively, as discussed below.

Figure 5:
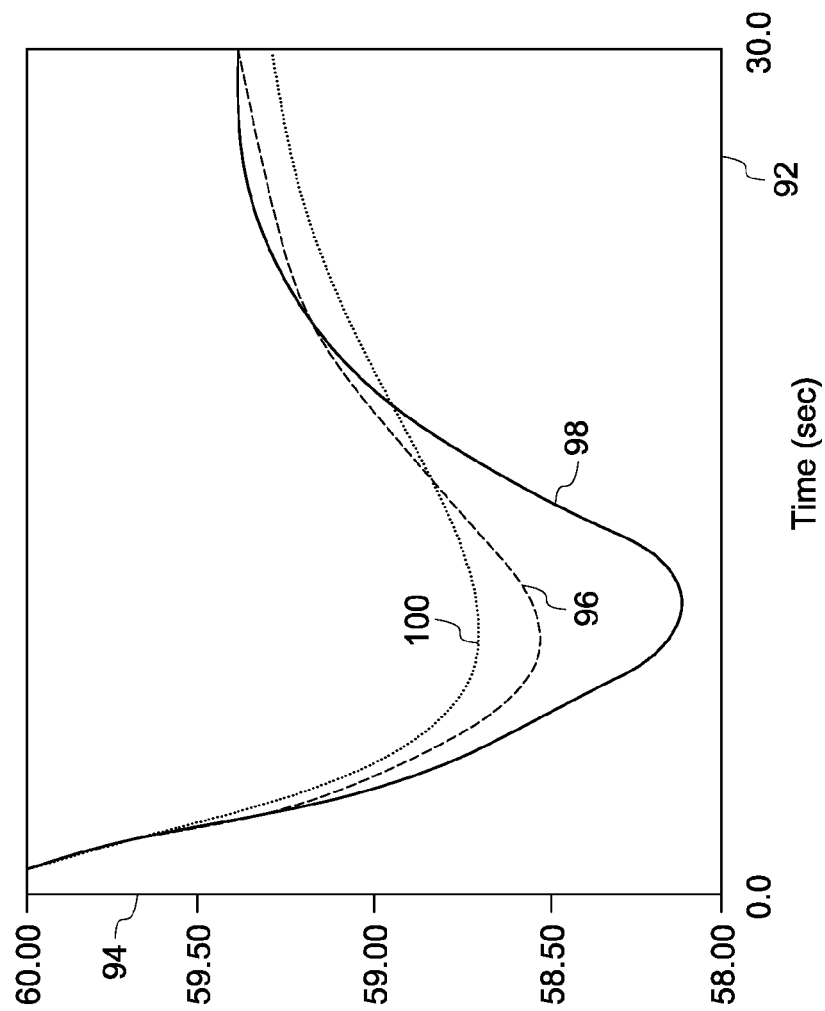
FIG. 5 is a simulated graph illustrating an expected response to power shaping.

FIG. 5 represents a simulated graph 90 illustrating expected response to power shaping. The horizontal axis 92 shows a time scale in seconds and the vertical axis 94 shows frequency in Hz. Curve 96 illustrates a simulated power system response to a frequency dip without solar power generation coupling. Curve 98 illustrates a simulated system response when 90% conventional power and 10% of solar power are used and subjected to a frequency dip without the energy storage device or stabilization control described herein. Curve 100 illustrates a simulation of embodiments with solar power and stabilization control. As can be seen from the curves 96, 98 and 100, when the energy storage device is used for stabilization (i.e. curve 100), then the dip in the frequency is lower compared to other two cases.

Figure 6:
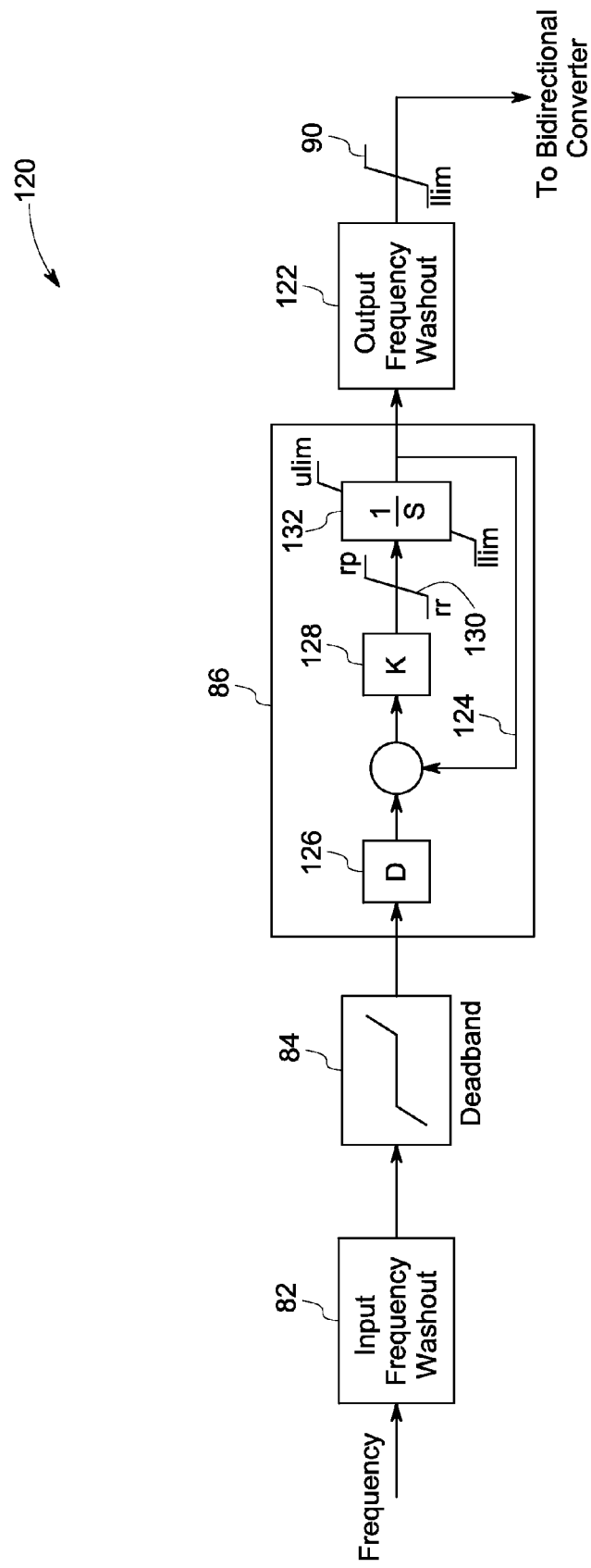
FIG. 6 is a more detailed block diagram of a more specific control system embodiment disclosed herein.

FIG. 6 is a more detailed block diagram 120 of a specific embodiment disclosed herein wherein an output frequency washout 122 is configured to drive an adjustment signal ΔP to zero. Output frequency washout 122 is shown in the illustrated position for purposes of example only and may be present in any appropriate control block. For example, in another embodiment, the washout function may be included within control loop 124. In the embodiment of FIG. 6, power shaper 86 comprises a gain block 126 and a control loop 124 used to provide a shaping response which is faster upon initiation and slower upon recovery (in other words "fast up, slow down"). The gain of block 126 may vary and will typically be set according to location and system requirements.

Within control loop 124, gain block 128 and ramp limiter 130 are used to control the rate of signal adjustment for integrator 132. The gain of block 128 is typically a fixed value designed to control the response of the control loop. In ramp limiter 130, the rp limit is designed to provide a sufficiently large positive ramp-up rate to provide the compensation, and the rr limit is designed to provide a sufficiently small negative ramp-down rate in order to avoid oscillatory compounding. Thus, the frequency is quickly compensated for upon an event, but the power adjustment after the event recovers slowly.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A power generation system comprising:
a DC to DC converter;
a DC to AC converter coupled to the DC to DC converter, wherein the combination of the DC to DC converter and the DC to AC converter is configured for supplying power from a photovoltaic (PV) module to a power grid;
a bidirectional converter coupled to the DC to AC converter;
an energy storage device coupled to the bidirectional converter;
a control system configured for generating commands for controlling a state of charge of the energy storage device, the control system comprising:
a deadband limiter configured for detecting when a frequency signal is outside of a respective signal range;
a power shaper configured for providing a transient power generation adjustment signal in response to the signal being outside of the respective signal range; and
a limit controller configured to prevent the adjustment signal from causing the energy storage device to operate outside of at least one operating constraint.

2. The power generation system of claim 1 wherein the control system is further configured for generating commands for providing energy from the PV module to the energy storage device upon the occurrence of excess power being supplied by the PV module.

3. The power generation system of claim 2, wherein the bidirectional converter comprises a DC to DC converter.

4. The power generation system of claim 3, wherein the bidirectional converter comprises a DC to AC inverter.

5. The power generation system of claim 1 wherein the bidirectional converter is coupled between the energy storage device and a DC link between the DC to DC and DC to AC converters.

6. The power generation system of claim 1 wherein the bidirectional converter is coupled between the energy storage device and an output side of the DC to AC converter.

7. The power generation system of claim 1, wherein the energy storage comprises a supercapacitor, an electrochemical battery, or combinations thereof.

8. The power generation system of claim 1, wherein the at least one operating constraint includes an operating current range or an operating voltage range of the energy storage device.

9. The power generation system of claim 8 further comprising an output frequency washout configured to drive the adjustment signal to zero.

10. The power generation system of claim 1 further comprising an input frequency washout configured for calculating a frequency deviation, wherein the deadband limiter is configured to use the frequency deviation to set the respective signal range.

11. The power generation system of claim 1, wherein the adjustment signal comprises a power command or a current command.

12. The power generation system of claim 1, wherein the power shaper is configured for providing the adjustment signal in a manner designed to limit oscillatory coupling.

13. The power generation system of claim 1, wherein the power shaper comprises at least one gain element or parameter configured for having a variable value in response to at least one of a utility condition and a utility command.

14. The method of claim 13, wherein the transient power generation adjustment signal is constrained for not causing the energy storage device to operate at a current outside of an operating current range.

15. The method of claim 13, wherein the transient power generation adjustment signal comprises a charging signal or a discharging signal for the energy storage device.

16. A method of delivering solar power from a power generation system comprising a photovoltaic (PV) module and an energy storage device, the method comprising:
determining when a frequency signal of the power generation system comprising the PV module is outside a respective signal range;
providing a transient power generation adjustment signal in response to the frequency signal being outside of the respective signal range; and
providing transient power from the energy storage device based on the transient power generation adjustment signal.

* * * * *